(12) United States Patent
Song et al.

(10) Patent No.: US 7,830,464 B2
(45) Date of Patent: Nov. 9, 2010

(54) ARRAY SUBSTRATE FOR FRINGE FIELD SWITCHING MODE LIQUID CRYSTAL DISPLAY DEVICE AND METHOD OF FABRICATING THE SAME

(75) Inventors: In-Duk Song, Gumi-si (KR); Byoung-Ho Lim, Gumi-si (KR)

(73) Assignee: LG Display Co., Ltd., Seoul (KR)

( * ) Notice: Subject to any disclaimer, the term of this patent is extended or adjusted under 35 U.S.C. 154(b) by 424 days.

(21) Appl. No.: 12/153,080

(22) Filed: May 13, 2008

(65) Prior Publication Data
US 2008/0303024 A1 Dec. 11, 2008

(30) Foreign Application Priority Data
Jun. 8, 2007 (KR) .................. 10-2007-0056099

(51) Int. Cl.
*G02F 1/136* (2006.01)
(52) U.S. Cl. .................. 349/43; 349/141; 349/142
(58) Field of Classification Search ............ 349/43, 349/141–142
See application file for complete search history.

(56) References Cited

U.S. PATENT DOCUMENTS

2006/0138417 A1* 6/2006 Ahn et al. .................. 257/59
2006/0139504 A1* 6/2006 Ahn et al. .................. 349/42

* cited by examiner

*Primary Examiner*—David Nelms
*Assistant Examiner*—Phu Vu
(74) *Attorney, Agent, or Firm*—McKenna Long & Aldridge

(57) ABSTRACT

An array substrate for a fringe field switching mode liquid crystal display device comprises a gate line on a substrate; a gate electrode connected to the gate line; a gate insulating layer on the gate line and the gate electrode; a semiconductor layer on the gate insulating layer and corresponding to the gate electrode; source and drain electrodes on the semiconductor layer and spaced apart from each other, the source electrode having first and second sub-source layers, the drain electrode having first and second sub-drain layers. Also disclosed in a method of fabricating a fringe field switching mode liquid crystal display device.

17 Claims, 12 Drawing Sheets

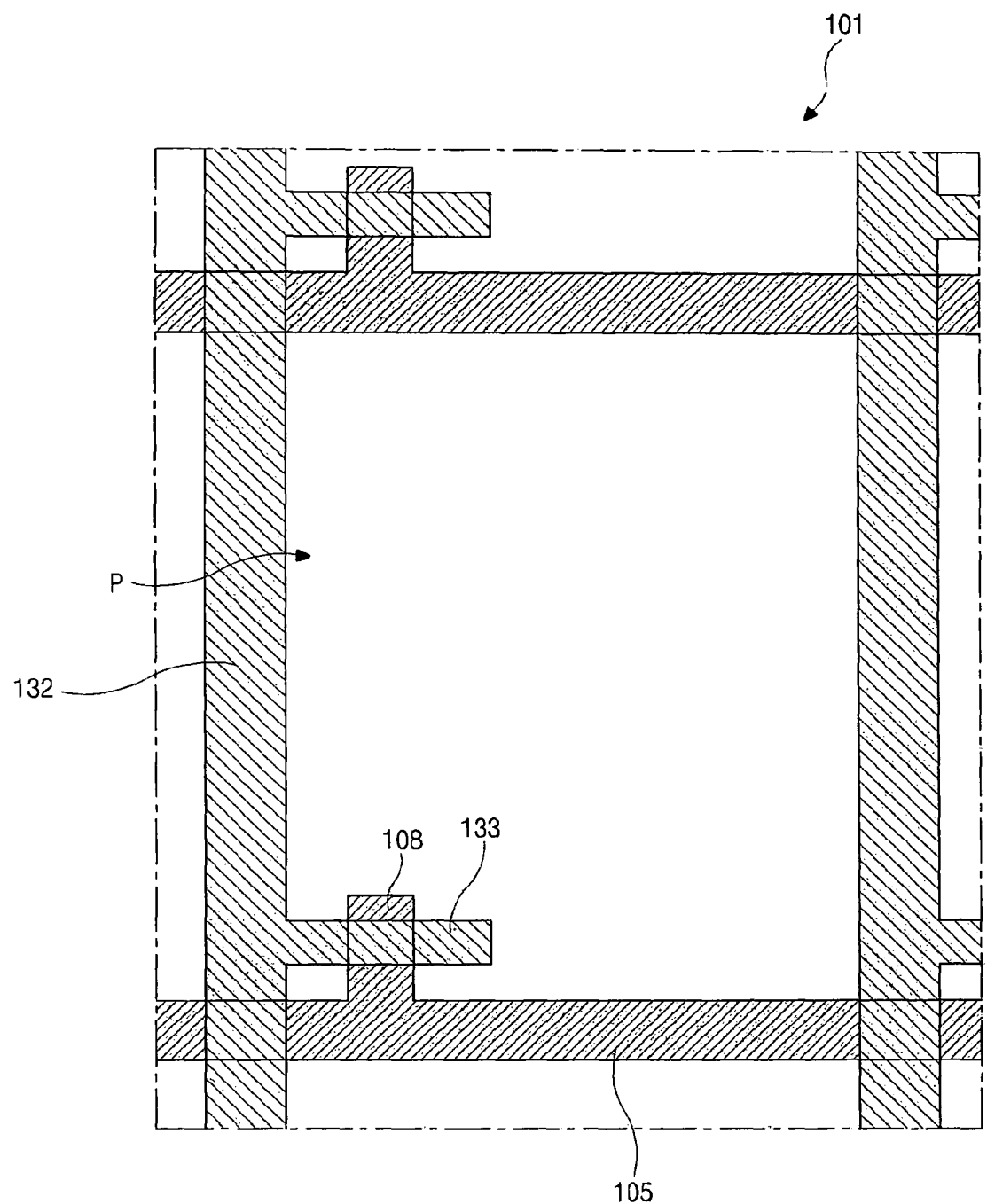

US 7,830,464 B2

ARRAY SUBSTRATE FOR FRINGE FIELD SWITCHING MODE LIQUID CRYSTAL DISPLAY DEVICE AND METHOD OF FABRICATING THE SAME

The present application claims the benefit of Korean Patent Application No. 2007-0056099 filed in Korea on Jun. 8, 2007, which is hereby incorporated by reference for all purposes as if fully set forth herein.

BACKGROUND OF THE INVENTION

1. Field of the Invention

The present invention relates to an array substrate for a fringe field switching (FFS) mode liquid crystal display (LCD) device, and more particularly, to an array substrate for an FFS mode LCD device capable of preventing a wavy noise problem and a photo leakage current problem. The FFS mode LCD device yields reduced production costs. There is also a method of fabricating the array substrate.

2. Discussion of the Related Art

A related art liquid crystal display (LCD) device uses optical anisotropy and polarization properties of liquid crystal molecules. The liquid crystal molecules have a definite alignment direction as a result of their thin and long shapes. The alignment direction of the liquid crystal molecules can be controlled by application of an electric field across the liquid crystal molecules. As the intensity or direction of the electric field is changed, the alignment of the liquid crystal molecules also changes. Since incident light is refracted based on the orientation of the liquid crystal molecules due to the optical anisotropy of the liquid crystal molecules, images can be displayed by controlling light transmissivity.

Since the LCD device including a thin film transistor (TFT) as a switching element, referred to as an active matrix LCD (AM-LCD) device, has excellent characteristics such as high resolution and display of moving images, the AM-LCD device has been widely used.

The AM-LCD device includes an array substrate, a color filter substrate and a liquid crystal layer interposed therebetween. The array substrate may include a pixel electrode and TFT, and the color filter substrate may include a color filter layer and a common electrode. The AM-LCD device is driven by an electric field between the pixel electrode and the common electrode resulting in excellent properties of transmittance and aperture ratio. However, since the AM-LCD device uses a vertical electric field, the AM-LCD device has a bad viewing angle.

An in-plane switching (IPS) mode LCD device may be used to resolve the above-mentioned limitations. FIG. 1 is a cross-sectional view of an IPS mode LCD device according to the related art. As shown in FIG. 1, the array substrate and the color filter substrate are separated and face each other. The array substrate includes a first substrate 10, a common electrode 17 and a pixel electrode 30. Though not shown, the array substrate may include a TFT, a gate line, a data line, for example. The color filter substrate includes a second substrate 9, a color filter layer (not shown), for example. A liquid crystal layer 11 is interposed between the first substrate 10 and the second substrate 9. Since the common electrode 17 and the pixel electrode 30 are formed on the first substrate 10 on the same level, a horizontal electric field "L" is generated between the common and pixel electrodes 17 and 30.

FIGS. 2A and 2B are cross-sectional views showing turned on/off conditions of an IPS mode LCD device according to the related art. As shown in FIG. 2A, when the voltage is applied to the IPS mode LCD device, liquid crystal molecules 11a above the common electrode 17 and the pixel electrode 30 are unchanged. But, liquid crystal molecules 11b between the common electrode 17 and the pixel electrode 30 are horizontally arranged due to the horizontal electric field "L". Since the liquid crystal molecules are arranged by the horizontal electric field, the IPS mode LCD device has a characteristic of a wide viewing angle. FIG. 2B shows a condition when the voltage is not applied to the IPS mode LCD device. Because an electric field is not generated between the common and pixel electrodes 17 and 30, the arrangement of liquid crystal molecules 11 is not changed. However, the IPS mode LCD device has poor aperture ratio and transmittance.

A fringe field switching (FFS) mode LCD device has been introduced to resolve the above-mentioned limitations. FIG. 3 is a cross-sectional view of an array substrate for an FFS mode LCD device according to the related art. As shown in FIG. 3, an array substrate includes a substrate 41, a gate line (not shown), a data line (not shown), a thin film transistor (TFT) "Tr", a common electrode 44 and a pixel electrode 69. The gate line (not shown) and the data line (not shown) are formed on the substrate 41 and cross each other to define a pixel region P. The gate line (not shown) is insulated from the data line (not shown) due to a gate insulating layer 49. The TFT "Tr" is formed at a crossing portion, which is defined as a switching region "TrA", of the gate line (not shown) and the data line (not shown). The TFT "Tr" includes a gate electrode 46, a semiconductor layer 57 including an active layer 53 and an ohmic contact layer 55, a source electrode 60 and a drain electrode 62. The gate electrode 46 is connected to the gate line (not shown), and the source electrode 60 is connected to the data line (not shown).

A passivation layer 65 is formed to cover an entire surface of the substrate 41 and be disposed over the TFT "Tr". The passivation layer 65 has a drain contact hole 67 to expose a portion of the drain electrode 62. A plurality of pixel electrodes 69 are formed on the passivation layer 65 and spaced apart from each other. The pixel electrodes 69 are connected to the drain electrode 62 through the drain contact hole 67. In addition, a common electrode 44 having a plate shape is formed on the substrate 41 and under the gate insulating layer 44. When voltages are applied to the common electrode 44 and the pixel electrodes 69, a fringe field is induced to control liquid crystal molecules (not shown). Although the common electrode 44 and the pixel electrodes 69 are formed in the pixel region "P", aperture ratio and transmittance are not reduced because they are formed of a transparent conductive material.

The array substrate for the FFS mode LCD device is fabricated through five or six mask process. Among these processes, the five mask process is used to reduce production costs. The array substrate in FIG. 3 is formed by a five mask process. In the five mask process, the source and drain electrodes 60 and 62 and the semiconductor layer 57 are patterned by a single mask process using a diffractive mask or a halftone mask. As a result, the semiconductor layer 57, especially the active layer 53, protrude beyond the source and drain electrodes 60 and 62 such that both ends of the active layer 53 are not covered with the source and drain electrodes 60 and 62, as an "A" region. Although not shown, since the data line (not shown) is formed by the same mask process as the source electrode 60, a semiconductor pattern extending from the semiconductor layer 57 is formed under the data line (not shown). Similar to the semiconductor layer 57, the semiconductor pattern (not shown) protrudes beyond the data line (not shown) such that both ends of the semiconductor pattern (not shown) are not covered with the data line (not shown).

Because the active layer 53 of the first semiconductor layer 57 is formed of amorphous silicon, a photo leakage current is generated due to light from the backlight unit or ambient light. As a result, properties of the TFT "Tr" are degraded due to the photo leakage current. Moreover, because the active layer of the semiconductor pattern (not shown) under the data line (not shown) is also formed of amorphous silicon, a leakage current is also generated in the semiconductor pattern (not shown) due to ambient light. The light leakage current causes a coupling of signals in the data line (not shown) and the pixel electrode 69 to deteriorate, resulting in a wavy noise phenomenon when displaying images. A black matrix (not shown) designed to cover the protruding portion of the semiconductor pattern (not shown) reduces aperture ratio of the LCD device.

SUMMARY OF THE INVENTION

Accordingly, the present invention is directed to an array substrate for an FFS mode LCD device and a method of fabricating the same that substantially obviates one or more of the problems due to limitations and disadvantages of the related art.

Additional features and advantages of the invention will be set forth in the description which follows, and in part will be apparent from the description, or may be learned by practice of the invention. These and other advantages of the invention will be realized and attained by the structure particularly pointed out in the written description and claims hereof as well as the appended drawings.

To achieve these and other advantages and in accordance with the purpose of the present invention, as embodied and broadly described herein, an array substrate for a fringe field switching mode liquid crystal display device comprises a gate line on a substrate; a gate electrode connected to the gate line; a gate insulating layer on the gate line and the gate electrode; a semiconductor layer on the gate insulating layer and corresponding to the gate electrode; source and drain electrodes on the semiconductor layer and spaced apart from each other, the source electrode having first and second sub-source layers, the drain electrode having first and second sub-drain layers, wherein one side portion of the first sub-source layer has an identical end line with one side portion of the semiconductor layer, and one side portion of the first sub-drain layer has an identical end line with the other side portion of the semiconductor layer, and wherein the second sub-source layer covers an upper surface and a side surface of the first sub-source layer, and the second sub-drain layer covers an upper surface and a side surface of the first sub-drain layer; a data line having a double-layered structure and crossing the gate line to define a pixel region; a pixel electrode in the pixel region and extending from the second sub-drain layer; a passivation layer on the pixel electrode; and a common electrode on the passivation layer and having at least one opening corresponding to the pixel electrode.

In another aspect of the present invention, a method of fabricating an array substrate for a fringe field switching mode liquid crystal display device comprises forming a gate line and a gate electrode on a substrate, the gate electrode connected to the gate line; forming a gate insulating layer on the gate line and the gate electrode; forming a first semiconductor pattern on the gate insulating layer, a metal pattern on the first semiconductor pattern and a first sub-data line over the gate insulating layer, the first semiconductor pattern corresponding the gate electrode, the metal pattern having an identical end line with the first semiconductor pattern, the first sub-data line connected to the metal pattern and crossing the gate line to define a pixel region; forming a first sub-source layer, a first sub-drain layer, a second sub-data line and a pixel electrode, the first sub-source layer and the first sub-drain layer disposed on the metal pattern and spaced apart from each other, the second sub-data line disposed on the first sub-data line, the pixel electrode disposed in the pixel region and extending from the first sub-drain layer; etching an exposed portion of the metal pattern between the first sub-source layer and the first sub-drain layer to form a second sub-source layer under the first sub-source layer and a second sub-drain layer under the first sub-drain layer; forming a passivation layer on the pixel electrode; and forming a common electrode on the passivation layer and having at least one opening corresponding to the pixel electrode.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE ILLUSTRATED EMBODIMENTS

Reference will now be made in detail to the preferred embodiments, examples of which are illustrated in the accompanying drawings.

Figure 1:
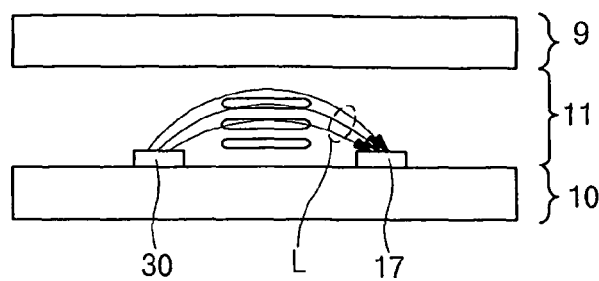
FIG. 1 is a cross-sectional view of an IPS mode LCD device according to the related art.
Figure 2A:
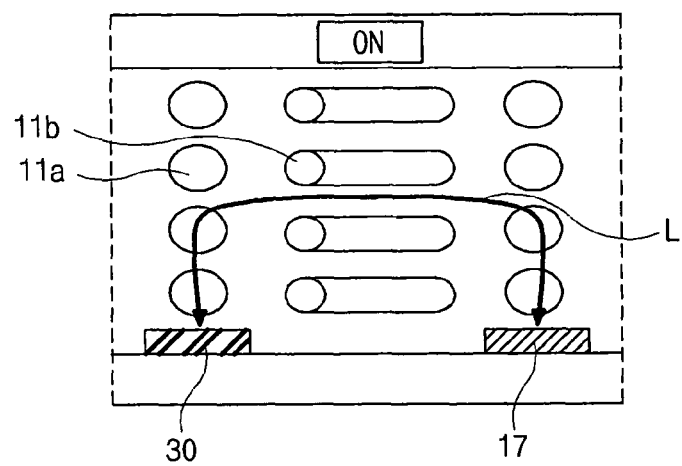
FIGS. 2A and 2B are cross-sectional views showing turned on/off conditions of an IPS mode LCD device according to the related art.
Figure 2B:
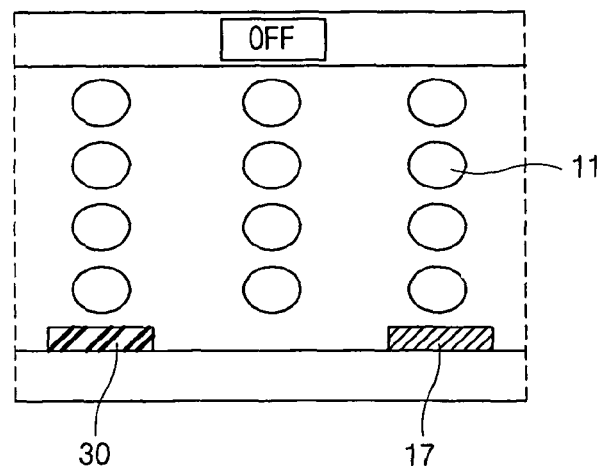
Figure 3:
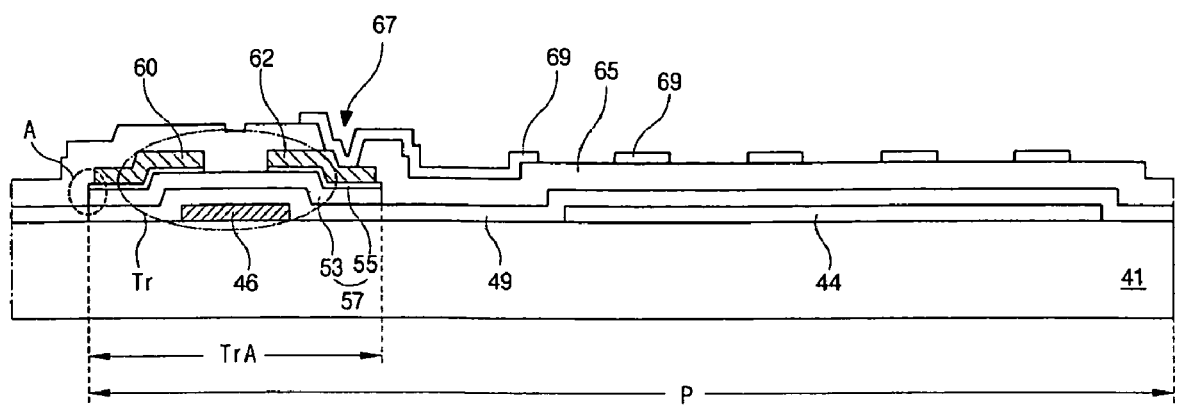
FIG. 3 is a cross-sectional view of an array substrate for an FFS mode LCD device according to the related art.
Figure 4:
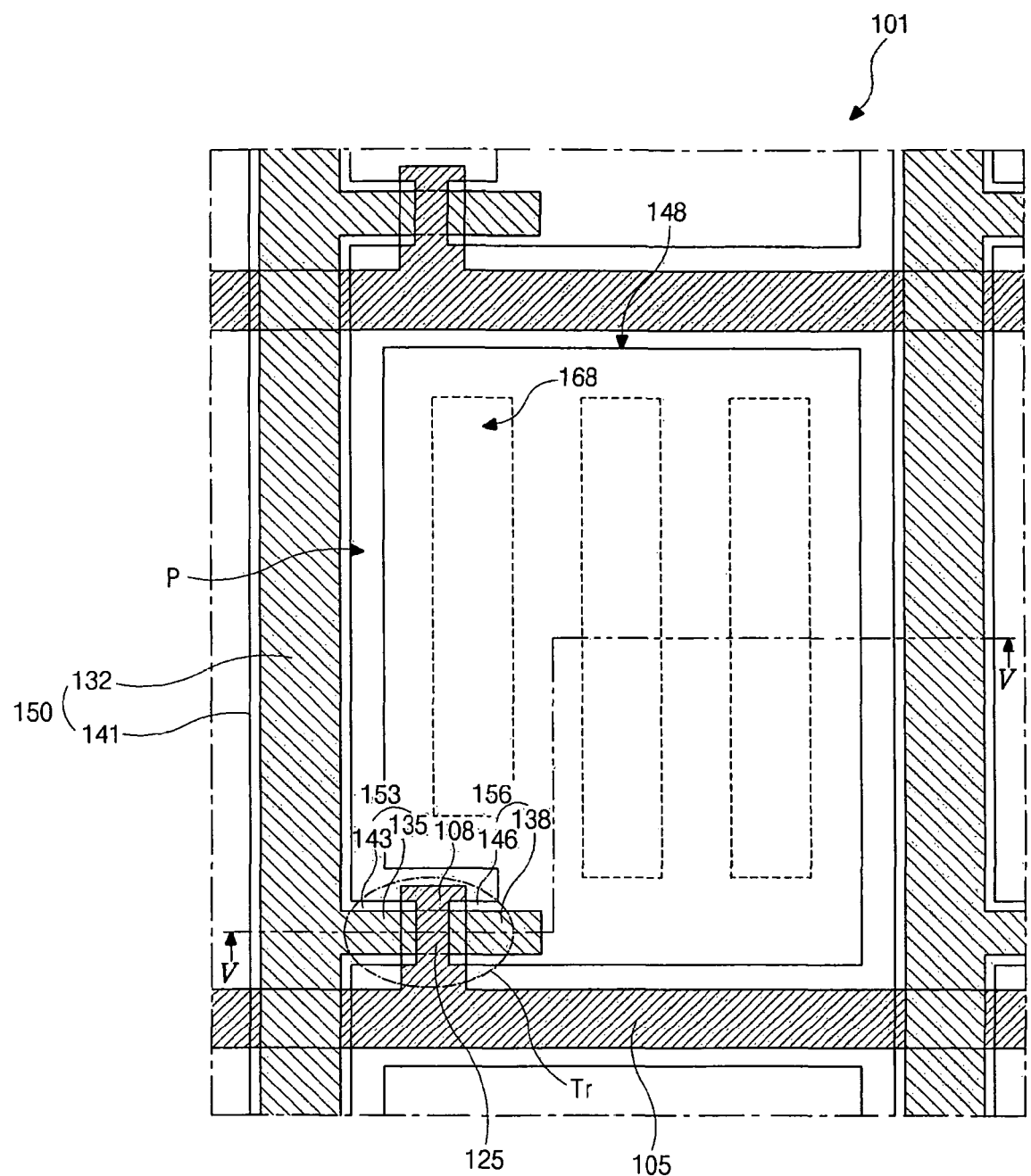
FIG. 4 is a plan view showing one pixel region of an array substrate for an FFS mode LCD device according to an embodiment of the present invention.
Figure 5:
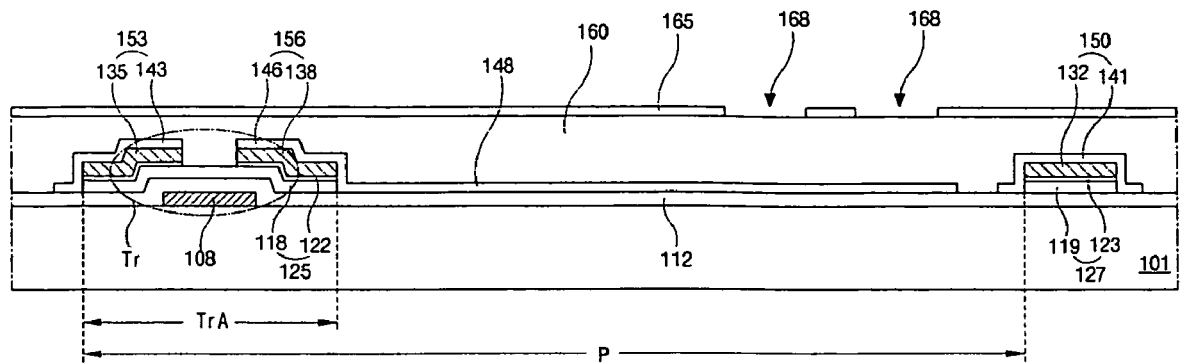
FIG. 5 is a cross-sectional view taken along the line V-V of FIG. 4.

FIG. 4 is a plan view showing one pixel region of an array substrate for an FFS mode LCD device according to an embodiment of the present invention, and FIG. 5 is a cross-sectional view taken along the line V-V of FIG. 4.

In FIG. 4, a gate line 105 is formed along a first direction on a substrate 101, and a data line 150 along a second direction cross the gate line 205 to define a pixel region "P". A thin film transistor (TFT) "Tr", which includes a gate electrode 108, a gate insulating layer (not shown), a semiconductor layer 125, a source electrode 153 and a drain electrode 156, is formed at a crossing portion of the gate and data lines 105 and 150. Each of the data line 150, the source electrode 153 and the drain electrode 156 includes a double-layered structure. The data line 150 includes first and second sub-data layers 132 and 141, the source electrode 153 includes first and second sub-source layers 135 and 143, and the drain electrode 156 first and second sub-drain layers 238 and 146.

In addition, a pixel electrode 148, which is connected to the drain electrode 156 of the TFT "Tr", is formed in the pixel region "P". The pixel electrode 148 may have a plate shape and cover an entire surface of the pixel region "P". The pixel electrode 148 is formed of the same material and the same layer as the second sub-drain layer 146 corresponding to an upper layer of the double-layered structure of the drain electrode 156. Furthermore, a common electrode (not shown) having a plurality of openings 168 is formed in the pixel region "P". The common electrode (not shown) overlaps the pixel electrode 148. Each of the plurality of openings 168 has a slit shape. Although not shown, a passivation layer is interposed between the pixel electrode 148 and the common electrode (not shown) such that a fringe field is induced therebetween when voltages are applied to them.

Referring to FIG. 5, the gate line (not shown) and the gate electrode 108, which are formed of a low resistance metallic material, are formed on the transparent substrate 101. The gate electrode 108 may extend from the gate line (not shown). The gate electrode 108 is formed at a switching region where the TFT "Tr" is formed.

The gate insulating layer 112 is formed on the gate line (not shown) and the gate electrode 108, and covers an entire surface of the substrate 101. The semiconductor layer 125 including an active layer 118 of intrinsic amorphous silicon and an ohmic contact layer 122 of impurity-doped amorphous silicon is formed on the gate insulating layer 112. The semiconductor layer 125 corresponds to the gate electrode 108.

The source electrode 153 and the drain electrode 156 are formed on the ohmic contact layer 122 and spaced apart from each other. The ohmic contact layer 122 between the source and drain electrodes 153 and 156 are removed such that the active layer 118 is exposed. In addition, the data line 150, which crosses the gate line (not shown) to define the pixel region "P" and is connected to the source electrode 153, is also formed over the gate insulating layer 122. Since a metal layer (not shown) and amorphous silicon layers are patterned through a single mask process, a semiconductor pattern 127 including an active pattern 119 and an ohmic contact pattern 123 is disposed under the data line 150. However, the semiconductor layer 125 and the semiconductor pattern 127 do not protrude beyond the source and drain electrodes 153 and 153 and the data line 150, respectively.

As mentioned above, each of the source electrode 153, the drain electrode 153 and the data line 150 has the double-layered structure. Each of the first sub-data layer 132, the first sub-source electrode 135 and the first sub-drain electrode 138, which respectively corresponds to a lower layer of the source electrode 153, the drain electrode 153 and the data line 150, includes a low resistance metallic material, while each of the second sub-data layer 141, the second sub-source electrode 143 and the second sub-drain electrode 146, which respectively corresponds to an upper layer of the source electrode 153, the drain electrode 153 and the data line 150, includes a transparent conductive material. Not only an upper surface of the first sub-data layer 132 but also side surfaces of the first sub-data layer 132 are covered with the second sub-data layer 141. Since the semiconductor pattern 127, which extends from the semiconductor layer 125, is disposed under the first sub-data layer 132, the second sub-data layer 141 covers side surfaces of the semiconductor pattern 127. Also, not only an upper surface of the first sub-source layer 135 but also side surfaces of the first sub-source layer 135 are covered with the second sub-source layer 143, and not only an upper surface of the first sub-drain layer 138 but also side surfaces of the first sub-drain layer 138 are covered with the second sub-drain layer 143. However, facing side surfaces of each of the first sub-source layer 135 and the first sub-drain layer 138 are not covered with the second sub-source layer 143 and the second sub-drain layer 146.

In an opposing portion of the source and drain electrodes 153 and 156, the first and second sub-source layers 135 and 143 and the first and second sub-drain layers 138 and 148 have the identical end line with opposing side surfaces of the ohmic contact layer 122, respectively. Namely, in a region where the source and drain electrodes 153 and 156 face each other, end lines of the first and second sub-source layers 135 and 143 are perfectly overlapped with each other, and end lines of the first and second sub-drain layers 138 and 148 are perfectly overlapped with each other.

The pixel electrode 148 extends from the second sub-drain layer 146 of the drain electrode 156 to be disposed in the pixel region "P" on the gate insulating layer 112. The pixel electrode 148 includes a transparent material and has a substantially plate shape.

The passivation layer 160 is formed on the pixel electrode 148 and covers an entire surface of the substrate 101. Since the pixel electrode 148 extends from the drain electrode 156, a drain contact hole for exposing the drain electrode 156 is not required in the passivation layer 160.

Although not shown, a gate pad electrode being connected to an end of the gate line and a data pad electrode being connected to an end of the data line 150 are formed over the substrate 101. The passivation layer 160 has a gate pad contact hole exposing the gate pad electrode and a data pad contact hole exposing the data pad electrode.

The common electrode 165 of a transparent conductive material is formed in the pixel region "P" on the passivation layer 160 including the gate pad contact hole (not shown) and the data pad contact hole (not shown). The common electrode 165 corresponds to the pixel electrode 148 and has a plurality of openings 168 of a slit or bar shape. The plurality of openings 168 are spaced apart from each other. There are three openings 168 in each pixel region in FIG. 4, while the common electrode 165 may has two to ten openings to produce an efficient fringe field.

Hereinafter, a method of fabricating an array substrate for an FFS mode LCD device shown in FIGS. 4 and 5 is described.

FIGS. 6A through 6E are cross-sectional views showing a process of fabricating one pixel region of an array substrate for an FFS mode LCD device according to an embodiment of the present invention, and FIGS. 7A through 7F are cross-sectional views showing a process of fabricating a portion taken along the line V-V of FIG. 4. For convenience, a region where a TFT is formed is defined as a switching region.

Figure 6A:
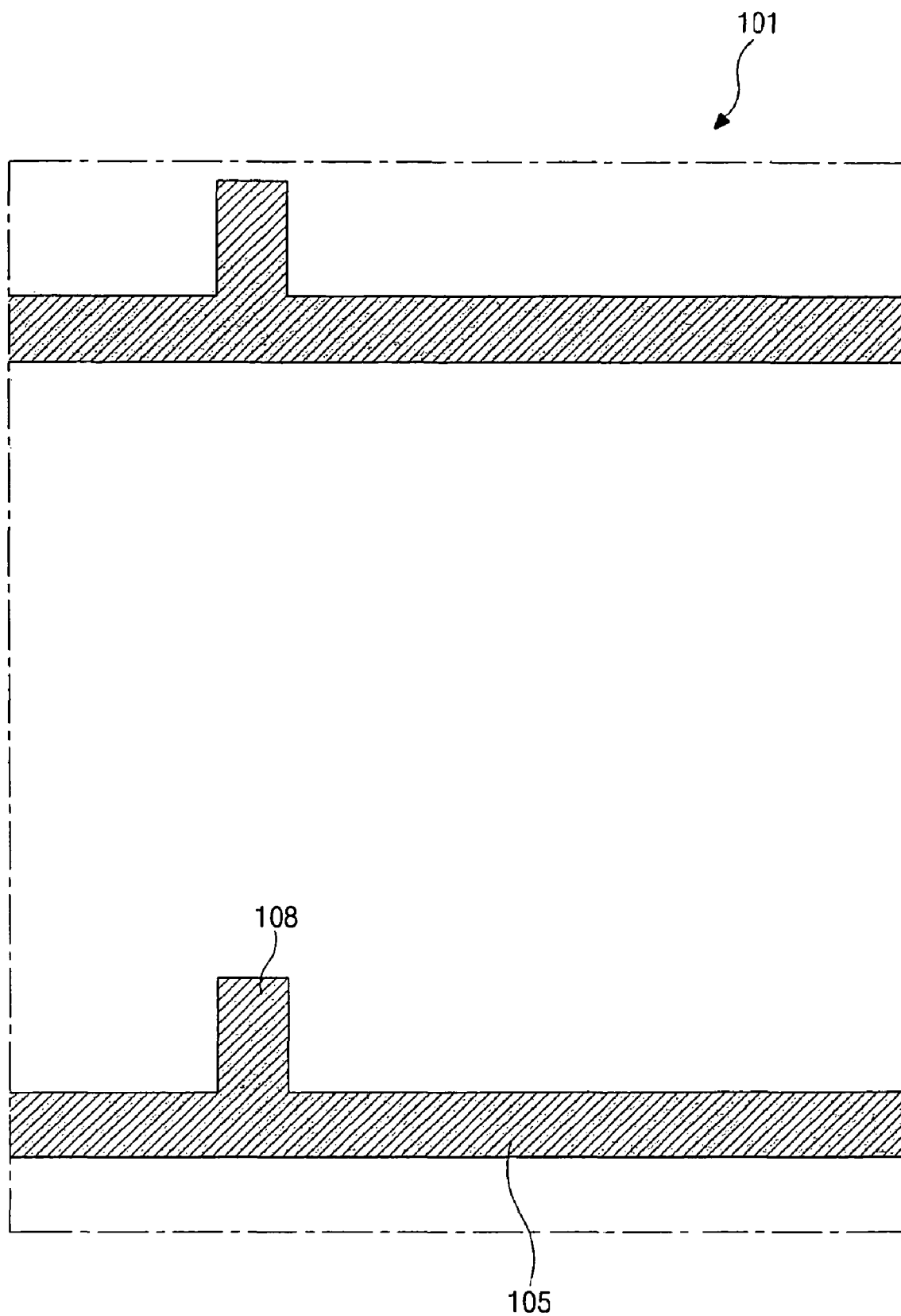
FIGS. 6A through and including 6E are cross-sectional views showing a process of fabricating one pixel region of an array substrate for an FFS mode LCD device according to an embodiment of the present invention.
Figure 7A:
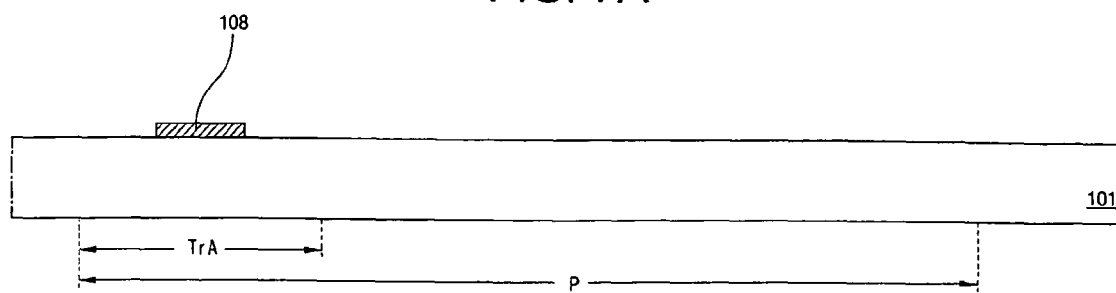
FIGS. 7A through and including 7F are cross-sectional views showing a process of fabricating a portion taken along the line V-V of FIG. 4.

In FIGS. 6A and 7A, a first low resistance metallic material is deposited on an entire surface of the substrate 101 to form a first metal layer (not shown). The first metallic material includes one of aluminum (Al), Al alloy (AlNd), molybdenum (Mo), copper (Cu), and Cu alloy or other suitable material. A mask process, which includes a step of coating a photoresist (PR) layer, a step of exposing the PR layer, a step of developing the exposed PR layer, a step of etching the corresponding metal layer and stripping remained PR patterns, is performed to pattern the first metal layer (not shown). As a result, the gate line 105 and the gate electrode 108 are formed on the substrate 101. The gate electrode 108 extends from the gate line 105 into the pixel region P and is disposed in the switching region "TrA". Although the gate line 105 and gate electrode 108 have a single-layered structure in FIGS. 6A and 7A, they may have a double-layered structure. A lower layer of the double-layered gate line and gate electrode may be Al alloy, while an upper layer of the double-layered gate line and gate electrode may be Mo, for example.

Figure 7B:
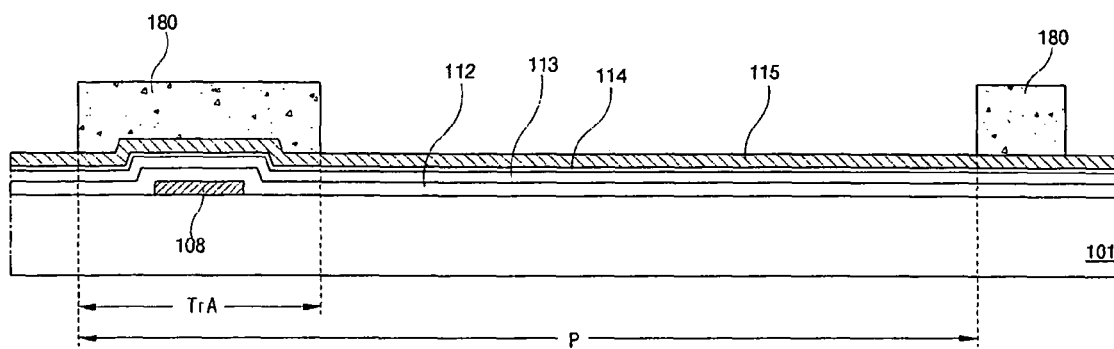

Next, as shown in FIG. 7B, the gate insulating layer 112 is formed on the gate line 105 and the gate electrode 108 by depositing an inorganic insulating material such as silicon nitride and silicon oxide. Sequentially, intrinsic amorphous silicon and impurity-doped amorphous silicon are deposited on the gate insulating layer 112 to form an intrinsic amorphous silicon layer 113 and an impurity-doped amorphous silicon layer 114. In addition, a second low resistance metallic material is deposited on the impurity-doped amorphous silicon layer 114 to form a second metal layer 115. The second metallic material includes one of Al, Al alloy, Mo, Cu and Cu alloy or other suitable material. Then, a PR material is coated on the second metal layer 115 to form a first PR layer (not shown). The first PR layer (not shown) is exposed using a mask and developed to form a first PR pattern 180. The first PR pattern 180 corresponds to a portion, where the data line is to be formed, and the switching region "TrA".

Figure 7C:
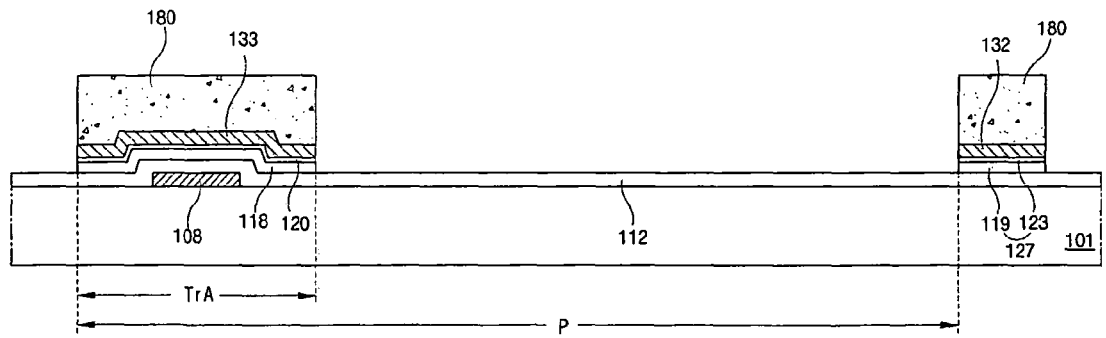

Next, as shown in FIGS. 6B and 7C, the second metal layer 115 (of FIG. 7B) exposed by the first PR pattern 180, and the impurity-doped amorphous silicon layer 114 and the intrinsic amorphous silicon layer 113 under the exposed second metal layer 115 (of FIG. 7B) are sequentially etched to form the first sub-data layer 132 from the second metal layer 115 (of FIG. 7B), an active layer 118 from the intrinsic amorphous silicon layer 113 (of FIG. 7B), an impurity-doped amorphous silicon pattern 120 from the impurity-doped amorphous silicon layer 114 (of FIG. 7B) and a metal pattern 133 from the second metal layer 115 (of FIG. 7B). The first sub-data layer 132 cross the gate line 105, and the active layer 118, the impurity-doped amorphous silicon pattern 120 and the metal pattern 133 are disposed in the switching region "P" to correspond to the gate electrode 108. Since the second metal layer 115 (of FIG. 7B), the impurity-doped amorphous silicon layer 114 (of FIG. 7B) and the intrinsic amorphous silicon layer 113 (of FIG. 7B) are sequentially patterned using a single mask, the semiconductor pattern 127 including the active pattern 119 and the ohmic contact pattern 123 is disposed under the first sub-data layer 132. In addition, the metal pattern 133, the impurity-doped amorphous silicon pattern 120 and the active layer 118 have the identical end line meaning that they perfectly overlap one another and have the same width and length. Then, the first PR pattern 180 is removed.

Figure 6C:
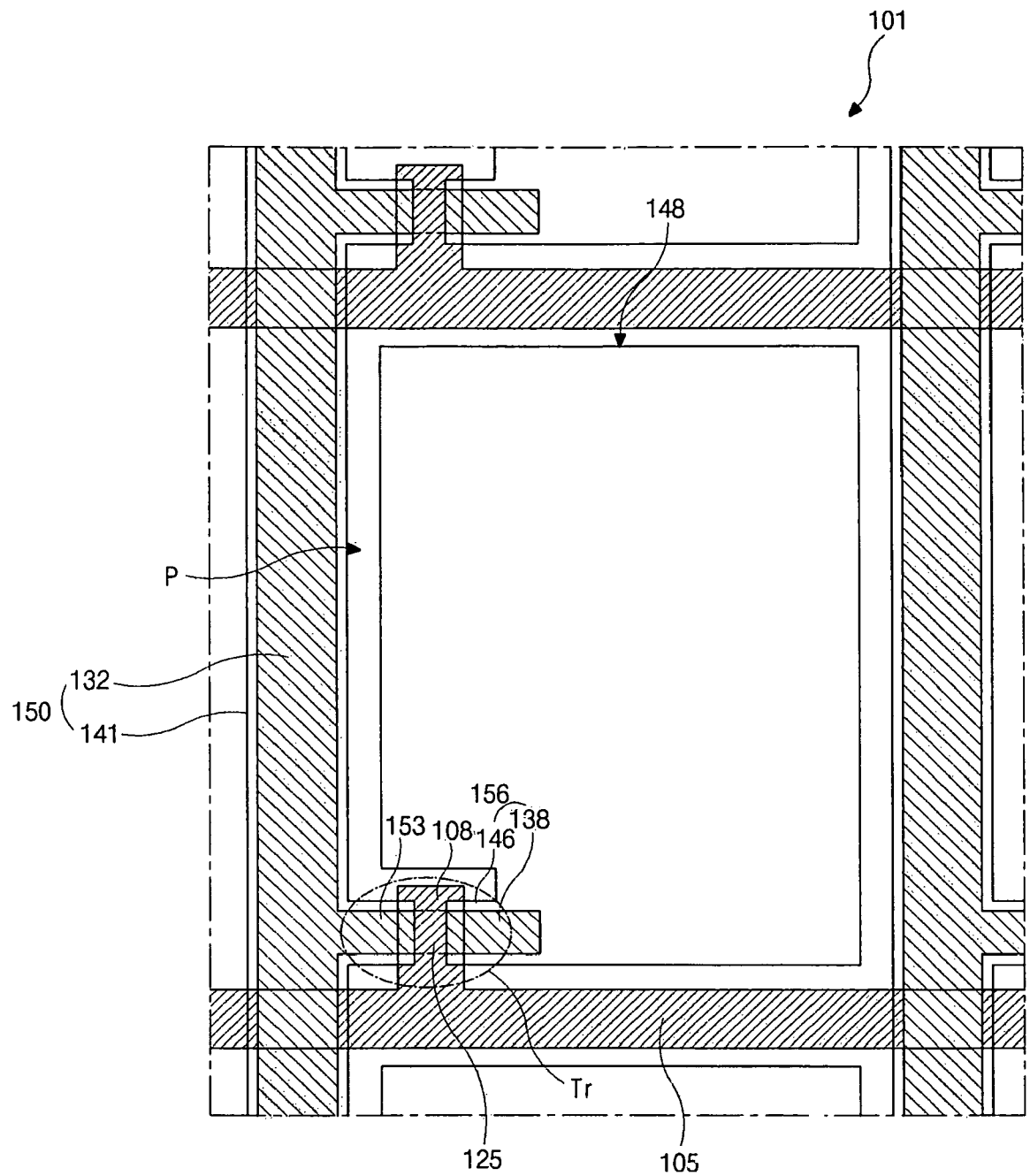
Figure 7D:
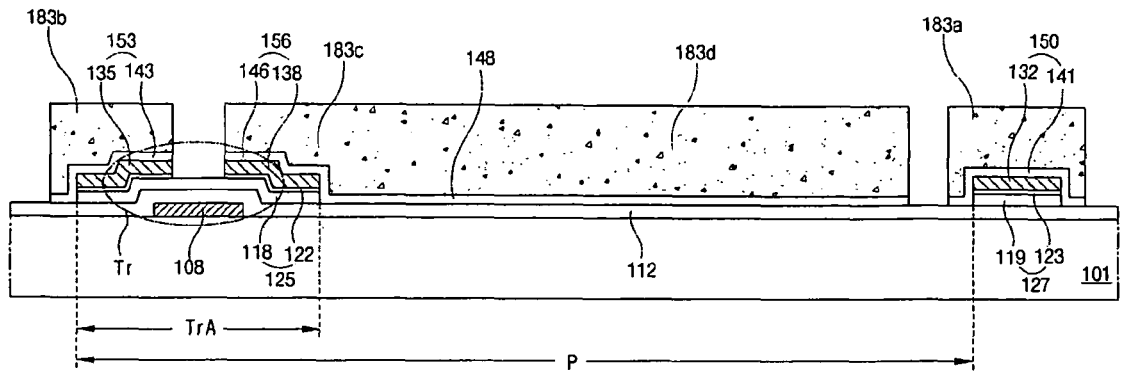

Next, as shown in FIGS. 6C and 7D, a transparent conductive material, such as indium-tin-oxide (ITO) and indium-zinc-oxide (IZO), is deposited on an entire surface of the substrate 101 including the first sub-data layer 132 and the metal pattern 133 to form a first transparent conductive material layer (not shown). A second PR layer (not shown) is formed on the first transparent conductive material layer (not shown) and patterned to form second to fifth PR patterns 180a, 180b, 180c and 180d. The second PR pattern 180a corresponds to the first sub-data layer 132 and has a width greater than the first sub-data layer 132. The third and fourth PR pattern 180b and 180c correspond to the switching region "TrA" and expose a portion of the first transparent conductive material layer (not shown) corresponding to a center of the gate electrode 108. The fifth PR pattern 180d corresponds to the pixel region "P" where the pixel electrode 148 is to be formed. The fifth PR pattern 180d extends from the fourth PR pattern 180c.

Exposed portions of the first transparent conductive material layer (not shown) between the second to fifth PR patterns 180a, 180b, 180c and 180d are etched using the second to fifth PR patterns 180a, 180b, 180c and 180d as an etching mask to form the second sub-data layer 141 on the first sub-data layer 132. The first and second sub-data layers 132 and 141 constitute the data line 150 crossing the gate line 105 to define the pixel region "P". The second sub-data layer 141 covers not only the upper surface of the first sub-data layer 132 but also the side surfaces of the first sub-layer 132. Moreover, the second sub-data layer 141 covers the side surface of the semiconductor pattern 127 under the first sub-data layer 132. Since the second PR pattern 183a has a width greater than the first sub-data layer 132, the second sub-data layer 141 also has a width greater than the first sub-data layer 132 such that the second sub-data layer 141 surrounds the first sub-data layer 132 and the semiconductor pattern 127.

Since the exposed portion of the first transparent conductive material layer (not shown) between the third and fourth PR patterns 180b and 180c is etched, the second sub-source layer 143 and the second sub-drain layer 146 are formed on the metal pattern 133 (of FIG. 7C). Moreover, the pixel electrode 148 extending from second sub-drain layer 146 and having a plate shape is formed in the pixel region "P". The pixel electrode 148 corresponds to the first transparent conductive material layer (not shown) under the fifth PR pattern 180d. Here, the second sub-source electrode 143 and the second sub-drain layer 146 cover one side surface and the other side surface of the metal pattern 133 (of FIG. 7C), the impurity-doped amorphous silicon pattern 120 (of FIG. 7C) and the active layer 118, respectively.

Sequentially, the metal pattern 133 (of FIG. 7C) exposed between the second sub-source layer 143 and the second sub-drain layer 146 is etched to form the first sub-source layer 135 and the first sub-drain layer 138 using the second sub-source layer 143 and the second sub-drain layer 146 as an etching mask. The first and second sub-source layers 135 and 143 constitute the source electrode 153, and the first and second sub-drain layers 138 and 146 constitute the drain electrode 156. The source electrode 153 is connected to the data line 150. Not only an upper surface of the first sub-source layer 135 but also side surfaces of the first sub-source layer 135 are covered with the second sub-source layer 143, and not only an upper surface of the first sub-drain layer 138 but also side surfaces of the first sub-drain layer 138 are covered with the second sub-drain layer 143. However, facing side surfaces of each of the first sub-source layer 135 and the first sub-drain layer 138 are not covered with the second sub-source layer 143 and the second sub-drain layer 146. Sequentially, the impurity-doped amorphous silicon pattern 120 exposed between the source and drain electrodes 153 and 156 are removed such that a portion of the active layer 118 is exposed. The metal pattern 133 (of FIG. 7C) and the impurity-doped amorphous silicon pattern 120 (of FIG. 7C) may be dry-etched. The active layer 118 and the ohmic contact layer 122 constitute the semiconductor layer 125, and the gate electrode 108, the gate insulating layer 112, the semiconductor layer 125, and the source and drain electrodes 153 and 156 constitute the TFT "Tr". Since the end portion of the active layer 118, the impurity-doped amorphous silicon pattern 120 (of FIG. 7C) and the metal pattern 133 (of FIG. 7C) are covered with the second sub-source layer 143 and the second sub-drain layer 146, they are not etched to have the identical end line. Accordingly, the semiconductor layer 125 and the semiconductor pattern 127, especially the active layer 118 and the active pattern 119, do not protrude beyond the source and drain electrodes 153 and 156 and the data line 150, respectively. As a result, a wavy noise problem and a photo leakage current problem are prevented.

Figure 6D:
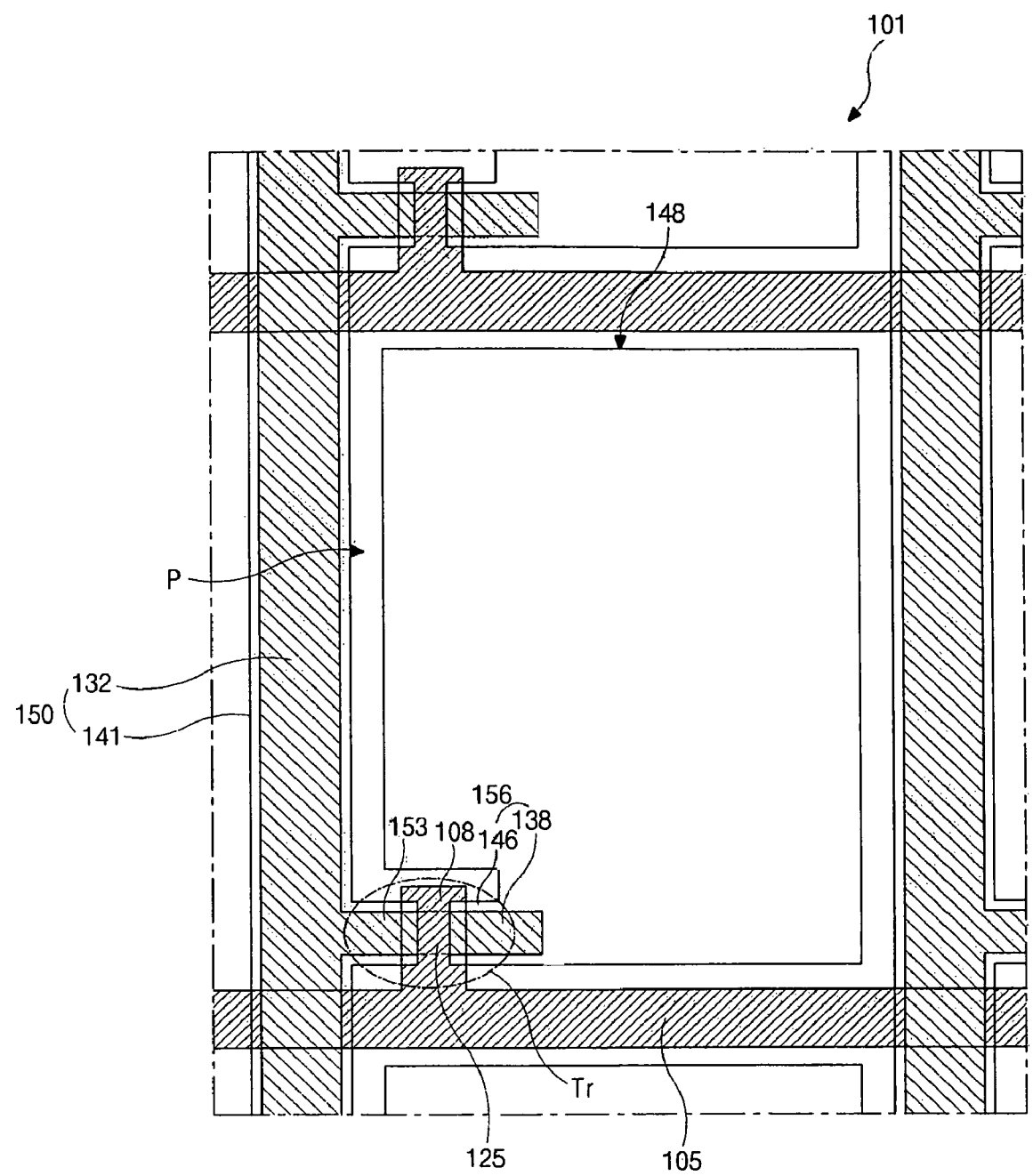
Figure 7E:
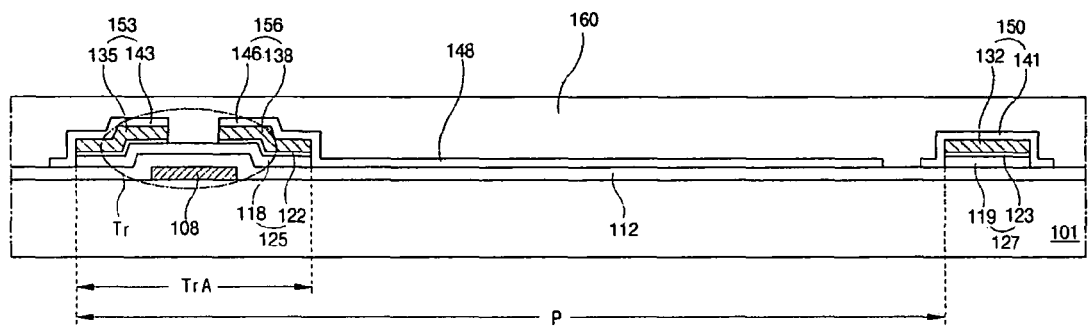

Next, as shown in FIGS. 6D and 7E, the second to fifth PR patterns 183a, 183b, 183c and 183d (of FIG. 7D) are removed. Then, the passivation layer 160 is formed on the data line 150, the source and drain electrodes 153 and 156, and the pixel electrode 148 by depositing one of an inorganic insulating material and an organic insulating material. The inorganic insulating material includes one of silicon nitride and silicon oxide, and the organic insulating material includes one of benzocyclobutene (BCB) and photoacryl. In FIG. 7E, the passivation layer 160 is formed of the organic insulating material to have an even upper surface.

Although not shown, the gate pad electrode being connected to an end of the gate line and a data pad electrode being connected to an end of the data line 150 are formed over the substrate 101 and under the passivation layer 160. In order to expose the gate pad electrode and the data pad electrode, the passivation layer 160 is patterned by a mask process to form the gate pad contact hole and the data pad contact hole.

Figure 6E:
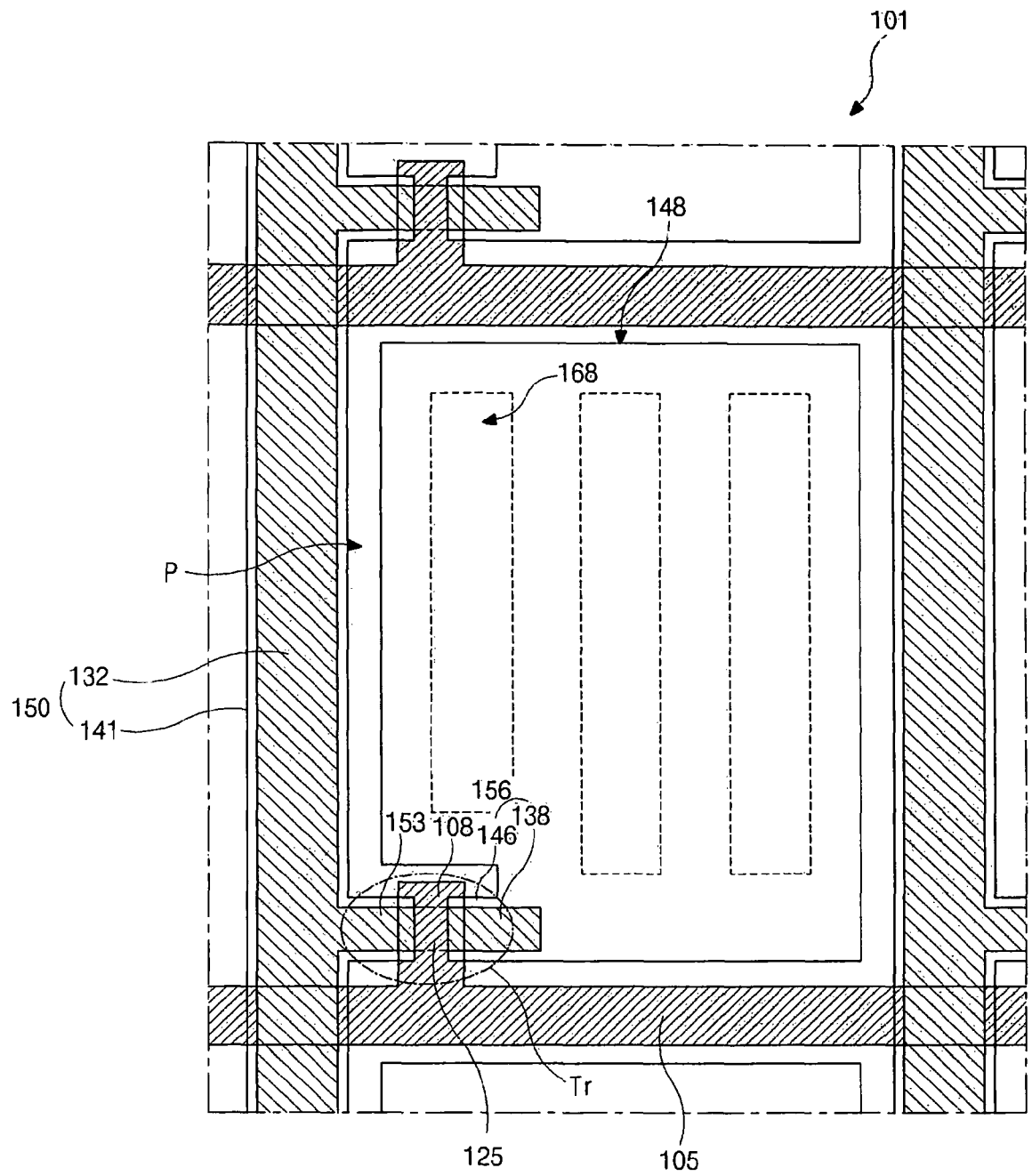
Figure 7F:
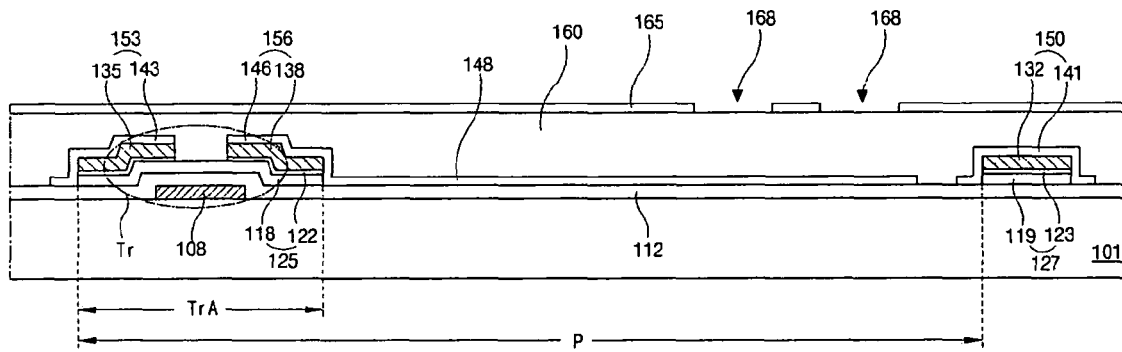

Next, as shown in FIGS. 6E and 7F, a transparent conductive material, such as indium-tin-oxide (ITO) and indium-zinc-oxide (IZO), is deposited to form a second transparent conductive material layer (not shown) on an entire surface of the passivation layer 160. The second transparent conductive material layer (not shown) is patterned to form the common electrode 165 in the pixel region "P". The common electrode 165 includes a plurality of openings 168. The common electrode 165 has a slit or bar shape and corresponds to the pixel electrode 148. Although not shown, an auxiliary gate pad electrode and an auxiliary data pad electrode are formed on the passivation layer 160 in the gate pad area and in the data pad area, respectively. The auxiliary gate pad electrode contacts the gate pad electrode through the gate pad contact hole, and the auxiliary data pad electrode contacts the data pad electrode through the data pad contact hole. However, the auxiliary gate pad electrode and the auxiliary data pad electrode are not essential. The auxiliary gate pad electrode and the auxiliary data pad electrode are electrically insulated from each other, and the common electrode 165 is also electrically insulated from the auxiliary gate pad electrode and the auxiliary data pad electrode. The common electrode 165 extends into one of the gate pad area and the data pad area such that a common voltage is applied from a printed circuit board to the common electrode 165.

Since the array substrate according the above embodiment of the present invention is fabricated through a five mask process without a diffractive mask or a half-tone mask, the production costs decreases. In addition, since there is no protruding portion of the active layer and active pattern beyond the source and drain electrodes and the data line, respectively, a wavy noise problem and a photo leakage current problem are prevented. Moreover, since the LCD device is driven by a fringe field, the LCD device has relatively high aperture ratio and brightness with a wide viewing angle.

Figure 8:
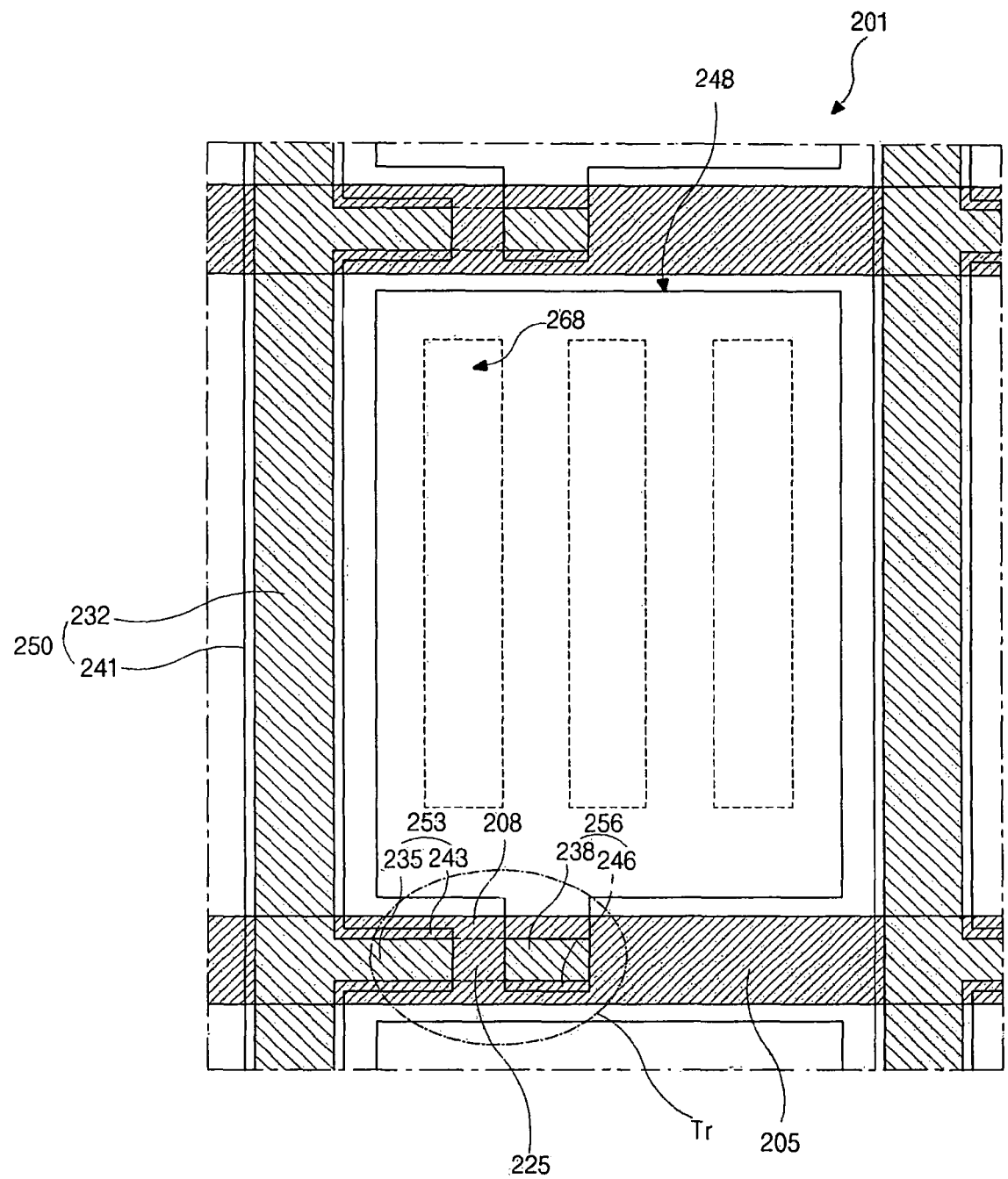
FIG. 8 is a plan view showing one pixel region of an array substrate for an FFS mode LCD device according to another embodiment of the present invention.

FIG. 8 is a plan view showing one pixel region of an array substrate for an FFS mode LCD device according to another embodiment of the present invention. In FIG. 8, since a TFT is formed to correspond to a portion of the gate line, aperture ration is further improved. Other elements have the same shape or locations as those of FIGS. 4 to 7F.

In FIG. 8, a gate line 205 is formed along a first direction on a substrate 201, and a data line 250 along a second direction crosses the gate line 205 to define a pixel region "P". A TFT "Tr" overlapping a portion of the gate line 205 is formed. The TFT "Tr" includes a gate electrode 208, a gate insulating layer (not shown), a semiconductor layer 225 and source and drain electrodes 253 and 256. The gate electrode 208 is defined as a portion of the gate electrode 205. The semiconductor layer 225 overlaps the gate pad with the gate insulating layer interposed therebetween. The source and drain electrodes 253 and 256 are disposed on the semiconductor layer 225 and spaced apart from each other. The source electrode 253 is connected to the data line 250. Similar to an embodiment in FIG. 4, each of the data line 250, the source electrode 253 and the drain electrode 256 has a double-layered structure. Namely, the data line 250 includes first and second sub-data layers 232 and 241, the source electrode 253 includes first and second sub-source layers 235 and 243, and the drain electrode 156 first and second sub-drain layers 238 and 246. Each of the first sub-data layer 232, the first sub-source layer 235 and the first sub-drain layer 238 is formed of a low resistance metallic material, while each of the second sub-data layer 241, the second sub-source layer 243 and the second sub-drain layer 246 is formed of a transparent conductive material. A pixel electrode 248 in the pixel region "P" extends from the second sub-drain layers 246. The pixel electrode 248 has a substantially plate shape.

In addition, a common electrode (not shown) is formed over the pixel electrode 248 with a passivation layer (not shown) interposed therebetween. The common electrode (not shown) has a plurality of openings 268. The plurality of openings 268 correspond to the pixel electrode 248 and are spaced apart from each other.

Since the array substrate in FIG. 8 includes the TFT overlapping a portion of the gate line, aperture ration is further improved.

It will be apparent to those skilled in the art that various modifications and variations can be made in the fringe field switching active matrix LCD device and fabricating method thereof of the present invention without departing from the spirit or scope of the invention. Thus, it is intended that the present invention cover the modifications and variations of this invention provided they come within the scope of the appended claims and their equivalents.

What is claimed is:

1. An array substrate for a fringe field switching mode liquid crystal display device, comprising:
   a gate line on a substrate;
   a gate electrode connected to the gate line;
   a gate insulating layer on the gate line and the gate electrode;
   a semiconductor layer on the gate insulating layer and corresponding to the gate electrode;
   source and drain electrodes on the semiconductor layer and spaced apart from each other, the source electrode having first and second sub-source layers, the drain electrode having first and second sub-drain layers, wherein one side portion of the first sub-source layer has an identical end line with one side portion of the semiconductor layer, and one side portion of the first sub-drain layer has an identical end line with the other side portion of the semiconductor layer, and wherein the second sub-source layer covers an upper surface and a side surface of the first sub-source layer, and the second sub-drain layer covers an upper surface and a side surface of the first sub-drain layer;
   a data line having a double-layered structure and crossing the gate line to define a pixel region;
   a pixel electrode in the pixel region and extending from the second sub-drain layer;
   a passivation layer on the pixel electrode; and
   a common electrode on the passivation layer and having at least one opening corresponding to the pixel electrode.

2. The array substrate according to claim 1, wherein the gate electrode overlaps a portion of the gate line.

3. The array substrate according to claim 1, wherein the second sub-source layer covers a side surface of the one side portion of the semiconductor layer, and the second sub-drain layer covers a side surface of the other side portion of the semiconductor layer.

4. The array substrate according to claim 1, further comprising a semiconductor pattern being disposed under the data line.

5. The array substrate according to claim 4, wherein a lower layer of the data line has an identical end line with semiconductor pattern.

6. The array substrate according to claim 5, wherein an upper layer of the data line covers side surfaces of the lower layer and side surfaces of the semiconductor layer.

7. The array substrate according to claim 1, wherein each of the second sub-source layer, the second sub-drain layer, an upper layer of the data line, the pixel electrode and the common electrode includes a transparent conductive material.

8. The array substrate according to claim 1, wherein an exposed portion of the semiconductor layer between the first sub-source layer and the first sub-drain layer perfectly overlaps an exposed portion of the semiconductor layer between the second sub-source layer and the second sub-drain layer.

9. The array substrate according to claim 1, wherein the pixel electrode has a substantially plate shape, and wherein the at least one opening has a substantially bar shape.

10. The array substrate according to claim 1, wherein the semiconductor layer includes amorphous silicon.

11. A method of fabricating an array substrate for a fringe field switching mode liquid crystal display device, comprising:
    forming a gate line and a gate electrode on a substrate, the gate electrode connected to the gate line;
    forming a gate insulating layer on the gate line and the gate electrode;
    forming a first semiconductor pattern on the gate insulating layer, a metal pattern on the first semiconductor pattern and a first sub-data line over the gate insulating layer, the first semiconductor pattern corresponding the gate electrode, the metal pattern having an identical end line with the first semiconductor pattern, the first sub-data line connected to the metal pattern and crossing the gate line to define a pixel region;
    forming a first sub-source layer, a first sub-drain layer, a second sub-data line and a pixel electrode, the first sub-source layer and the first sub-drain layer disposed on the metal pattern and spaced apart from each other, the second sub-data line disposed on the first sub-data line, the pixel electrode disposed in the pixel region and extending from the first sub-drain layer;
    etching an exposed portion of the metal pattern between the first sub-source layer and the first sub-drain layer to form a second sub-source layer under the first sub-source layer and a second sub-drain layer under the first sub-drain layer;
    forming a passivation layer on the pixel electrode; and
    forming a common electrode on the passivation layer and having at least one opening corresponding to the pixel electrode.

12. The method according to claim 11, wherein the step of forming the first semiconductor pattern, the metal pattern and the first sub-data line comprise:
    sequentially forming an intrinsic amorphous silicon layer, an impurity-doped amorphous silicon layer and a metal layer on the gate insulating layer; and
    etching the metal layer, the impurity-doped amorphous silicon layer and the intrinsic amorphous silicon layer by a single mask process to form the first semiconductor layer, which includes an active layer on the gate insulating layer and an ohmic contact pattern on the active layer, the metal pattern, a second semiconductor pattern, which includes a first layer from the intrinsic amorphous silicon layer and a second layer from the impurity-doped amorphous silicon layer, and the first sub-data line on the second semiconductor pattern.

13. The method according to claim 12, wherein the step of forming the first sub-source layer, the first sub-drain layer, the second sub-data line and the pixel electrode comprise:
    forming a transparent conductive material layer on an entire surface of the substrate including the metal pattern;
    forming first, second and third photoresist (PR) patterns on the transparent conductive material layer, the first PR pattern corresponding to the first sub-source layer having a width greater than the second sub-source layer, the second PR pattern corresponding to the first sub-drain layer and the pixel electrode, and the third PR pattern corresponding to the second sub-data line and having a width greater than the first sub-data line, wherein a portion of the transparent conductive material layer corresponding to the gate electrode is exposed between the first and second PR patterns; and
    etching the transparent conductive metal layer using the first, second and third PR patterns as an etching mask.

14. The method according to claim 13, further comprising etching an exposed portion of the ohmic contact pattern between the second sub-source layer and the second sub-drain layer to expose a portion of the active layer.

15. The method according to claim 13, wherein the first sub-data line has an identical end line with the second semiconductor pattern, and the second sub-data line covers side surfaces of the first sub-data line and side surfaces of the second semiconductor pattern.

16. The method according to claim 11, wherein the first sub-source layer covers one side surface of the second sub-source layer and one side surface of the first semiconductor pattern, and the first sub-drain layer covers one side surface of the second sub-drain layer and the other side surface of the first semiconductor layer.

17. The method according to claim 11, wherein the pixel electrode has a substantially plate shape, and the common electrode includes a transparent conductive material, and wherein the at least opening has a substantially bar shape.

* * * * *